United States Patent
Tejada et al.

(10) Patent No.: US 8,542,059 B2
(45) Date of Patent: Sep. 24, 2013

(54) ULTRA-LOW-POWER POWER SUPPLY SYSTEM FOR AN IC CHIP

(75) Inventors: Jose Tejada, Valencia (ES); Alberto Sanchez, Alzira (ES)

(73) Assignee: Analog Devices, Inc., Norwood, MA (US)

( * ) Notice: Subject to any disclaimer, the term of this patent is extended or adjusted under 35 U.S.C. 154(b) by 110 days.

(21) Appl. No.: 13/158,913

(22) Filed: Jun. 13, 2011

(65) Prior Publication Data

US 2012/0313696 A1    Dec. 13, 2012

(51) Int. Cl.
- G05F 1/46 (2006.01)
- G06F 1/26 (2006.01)
- H02M 3/06 (2006.01)

(52) U.S. Cl.
USPC .......................... 327/538; 323/282; 365/226

(58) Field of Classification Search
None
See application file for complete search history.

(56) References Cited

U.S. PATENT DOCUMENTS

| | | | |
|---|---|---|---|
| 5,467,010 A * | 11/1995 | Quarmby et al. | 323/284 |
| 7,818,599 B2 * | 10/2010 | Haridass et al. | 713/340 |
| 2012/0074986 A1 * | 3/2012 | Nakamura et al. | 327/102 |

* cited by examiner

*Primary Examiner* — Lincoln Donovan
*Assistant Examiner* — Terry L Englund
(74) *Attorney, Agent, or Firm* — Kenyon & Kenyon LLP

(57) ABSTRACT

Embodiments of the present invention may provide a power supply system that uses a capacitive voltage divider to selectively monitor various power supplies on an IC chip. The power supply system may sample a monitored power supply to a capacitor and select certain capacitors from a set of switched capacitors to divide down the sampled voltage. The resulting voltage may be compared to a voltage reference. Using different selections of switched capacitors, the monitored power supply may be compared for different voltage levels. The ratio of the sampling capacitor to the selected capacitors may determine a voltage level the comparator will trigger. Further, based on the monitored power supply level, the power supply system may turn on a switch between an external power supply and a regulated digital power supply to charge the regulated digital power supply while a main LDO is turned off.

24 Claims, 8 Drawing Sheets

US 8,542,059 B2

ULTRA-LOW-POWER POWER SUPPLY SYSTEM FOR AN IC CHIP

FIELD OF INVENTION

The present invention relates to power supply systems in integrated circuits, and more particularly to power-on reset (POR), power-supply monitor (PSM) and low-power voltage regulator (LDO) circuits consuming a low power and having a small area.

BACKGROUND

Conventional microcontrollers need POR and PSM circuits for their operation. Some microcontrollers also use a low-power LDO to maintain a regulated supply for a standby mode. FIG. 1 shows a power supply system 100 for a prior art microcontroller. The power supply system 100 includes a power supply $V_{BAT}$ that draws a supply voltage/current from an external power supply (e.g., a battery). The $V_{BAT}$ drives a LDO 102 for regulating a high operation power, a LDO2 104 for regulating a low operation power and a voltage reference circuit 112 for generating an internal voltage reference. The LDOs 102 and 104 drive a voltage on an internal supply line (DVDD) of an integrated circuit. The supply line DVDD may be connected to a capacitor 124. The voltage level on $V_{BAT}$ is monitored by a POR 114, PSM 116 and a POR2 118. Each of the POR 114, PSM 116 and POR2 118 compares the $V_{BAT}$ voltage level to a respective threshold value and generates a respective control signal (e.g., por_bat, psm_bat and por2_bat). The POR 114 typically is accurate within a rough resolution, for example, ~500mV. The POR2 118 normally has a more precise resolution. The digital supply DVDD is internally generated and used to supply power for digital logic 108, memories 110, and an oscillator 106. Sometimes, the oscillator 106 can also be powered by the $V_{BAT}$.

DVDD is traditionally monitored by POR 120 and PSM 122. Each of POR 120 and PSM 122 compares the DVDD voltage level to a respective threshold value and generates a respective control signal (e.g., por_dvdd and psm_dvdd). In the prior art microcontroller, POR, PSM are typically implemented as comparators to compare the monitored power supply or a divided-down version of it (e.g., $V_{BAT}$ or DVDD) to a reference voltage (e.g., the reference voltage generated by the voltage reference 112 or a reference voltage generated by a resistive divider from the reference voltage generated by the voltage reference 112). During a power down (e.g., low power operation or standby mode operation), the LDO2 104 keeps the DVDD high to preserve the content of the memories.

In a typical power supply system for a microcontroller, these POR, PSM and LDO circuit blocks take an area of as much as 0.3 mm$^2$ and consume almost 1 mA of current at room temperature (e.g., 27° C.). Therefore, the existing technology in power supply system for microcontrollers takes too much room on an integrated circuit (IC) chip and consumes too much power. Accordingly, there is a need in the art for providing a low power consumption and small area power supply system for an IC chip.

DETAILED DESCRIPTION

The disadvantages of the prior art are overcome by a power supply system that uses a capacitive voltage divider to selectively monitor various power supplies on an IC chip. The power supply system may sample a monitored power supply to a capacitor and select certain capacitors from a set of switched capacitors to divide down the sampled voltage. The resulting voltage may be compared to a voltage reference. Using different selections of switched capacitors, the monitored power supply may be compared for different voltage levels. The ratio of the sampling capacitor to the selected capacitors may determine a voltage level the comparator will trigger. Further, based on the monitored power supply level, the power supply system may turn on a switch between an external power supply and a regulated digital power supply to charge the regulated digital power line while the main LDO is turned off.

Figure 1:
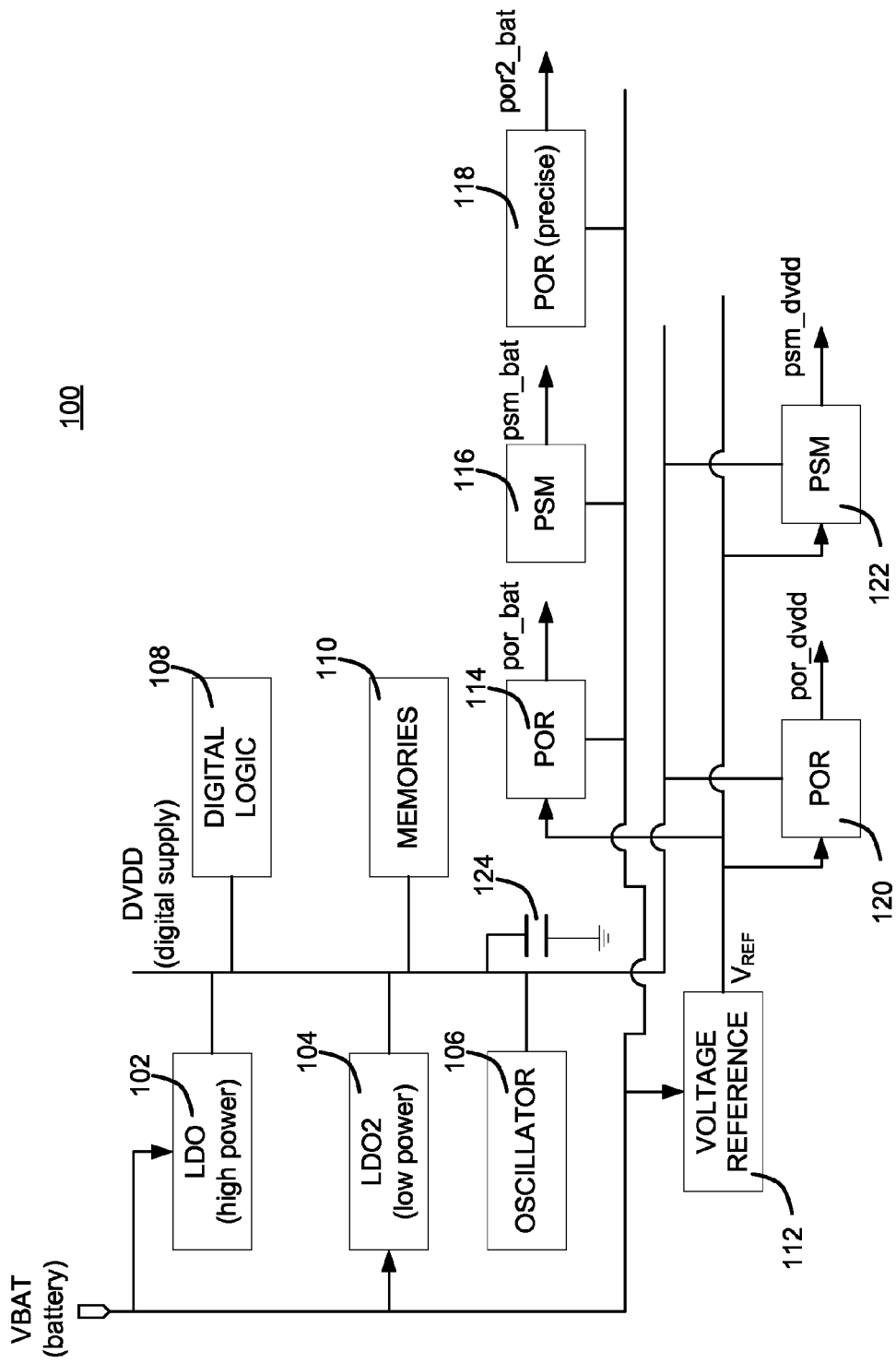
FIG. 1 illustrates a prior art power supply system for a microcontroller.
Figure 2:
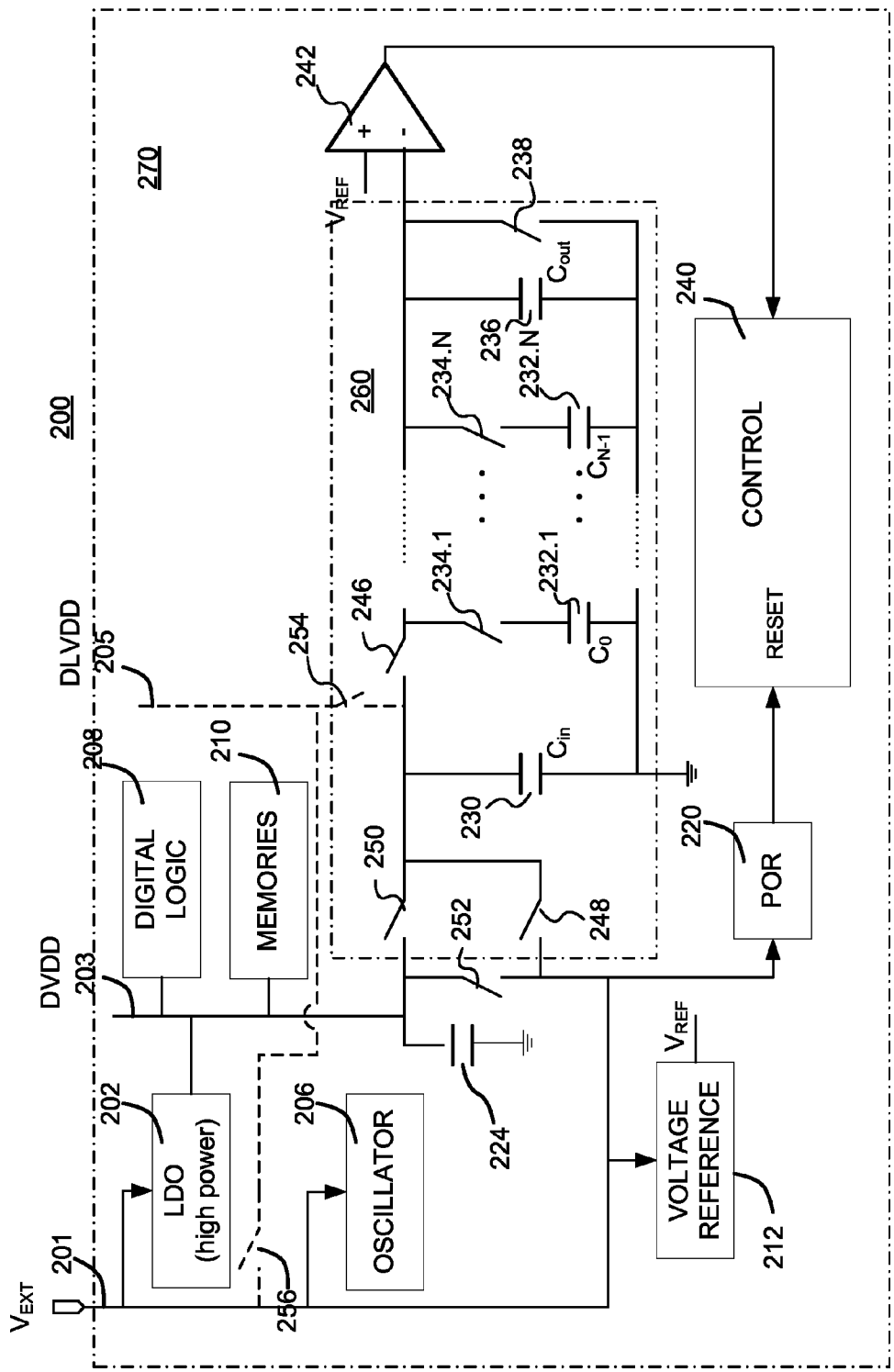
FIG. 2 illustrates a block diagram of a power supply system of an IC chip according to an embodiment of the present invention.

FIG. 2 is a block diagram of a power supply system 200 of an IC chip 270 according to an embodiment of the present invention. The power supply system 200 may comprise a first power supply line 201, a LDO 202, a second power supply line 203, a voltage reference generator 212, a POR 220, a switch 252, a capacitive voltage divider 260, a comparator 242 and a control logic block 240. In addition to the power supply system 200, the IC chip 270 may further include an oscillator 206, a digital logic circuit block 208, memories 210 and a capacitor 224.

The first power supply line 201 may be coupled to an external power supply (e.g., a battery) during operation. The voltage signal provided by the external power supply may be referred to as $V_{EXT}$. The LDO 202, oscillator 206 and the voltage reference generator 212 may be driven by $V_{EXT}$. The voltage level of $V_{EXT}$ may be monitored by the POR 220 during an initial power up process. When the $V_{EXT}$ reaches a predetermined level, the POR 220 may generate a RESET signal to start up the control logic block 240. In one embodiment, the POR 220 may be imprecise with a resolution around ~500 mV. The second power supply line 203 may provide digital supply power DVDD for the digital logic circuit block 208 and memories 210. In one embodiment, DVDD may be generated on the IC chip 270. In another embodiment, DVDD may be supplied from outside of the chip 270. The capacitor 224 may represent a parasitic capacitance between DVDD and ground or may represent a deliberate capacitor for purposes such as supply noise reduction and may be internal or external to the IC chip.

The LDO 202 may be a voltage regulator that maintains DVDD for high power operation (e.g., regular operation). The chip 270 may also support low power operation (e.g., standby mode operation). During a standby mode operation, the LDO 202 may be turned off.

The voltage reference generator 212 may generate a reference voltage $V_{REF}$ for the IC chip 270. In one embodiment, the voltage reference generator 212 may be a bandgap reference voltage generator.

The capacitive voltage divider 260 may comprise a first input switch 248, a second input switch 250, a share switch 246, an input capacitor $C_{in}$ 230, an output capacitor $C_{out}$ 236, a plurality of dividing switches 234.1~234.N, a plurality of voltage dividing capacitors $C_0$~$C_{N-1}$ 232.1~232.N (e.g., switched capacitors) and a clear switch 238. The first input switch 248 may control the connection between a first side (e.g., a top plate) of the input capacitor $C_{in}$ 230 and the first power supply line 201 (e.g., $V_{EXT}$). The second input switch 250 may control the connection between the first side of the input capacitor $C_{in}$ 230 and the second power supply line 203 (e.g., DVDD). The first side of the input capacitor $C_{in}$ 230 may be connected to a first side of the share switch 246. The second side of the share switch 246 may be coupled to a first side of the output capacitor $C_{out}$ 236 and also to an input to the comparator 242. Each of the voltage dividing capacitors $C_0$~$C_{N-1}$ 232.1~232.N may have a first side coupled to the second side of the share switch 246 via a respective dividing switches 234.1~234.N. Each of the input capacitor $C_{in}$ 230, output capacitor $C_{out}$ 236, and voltage dividing capacitors $C_0$~$C_{N-1}$ 232.1~232.N may have a second side (e.g., a bottom plate) connected to ground GND. The clear switch 238 may have a first side connected to the second side of the share switch 246 and a second side connected to ground GND.

During operation, the power supply system 200 may select one of the power supplies (e.g., $V_{EXT}$ or DVDD) for monitoring. For example, if $V_{EXT}$ is selected for monitoring, the power supply system 200 may close the switch 248 (while keep the switch 250 open) to let the input capacitor $C_{in}$ sample the voltage level on the first power supply line 201; on the other hand, if DVDD is selected for monitoring, the power supply system 200 may close the switch 250 (while keep the switch 248 open) to let the input capacitor $C_{in}$ sample the voltage level on the second power supply line 203. After a voltage level is sampled, the input switch (e.g., 248 or 250) may be disconnected, and the share switch 246 and one or more dividing switches 234.1~234.N may be closed to share the electrical charge of the input $C_{in}$ 230 with one or more selected voltage dividing capacitors and the output capacitor $C_{out}$ 236. Assuming the sampled input voltage level is $V_{in}$, a divided sampled voltage $V_{out}$ may be generated at the input to the comparator 242. The relationship between $V_{out}$ and $V_{in}$ may be determined by the equation of $$V_{out} = \frac{V_{in} \times C_{in}}{C_{in} + C_{out} + C_{select}}.$$

The divided sampled voltage $V_{out}$ may be compared by the comparator 242 to the reference voltage $V_{REF}$ generated by the voltage reference generator 212 to determine whether the divided sampled voltage $V_{out}$ is higher or lower than the reference voltage $V_{REF}$. Before each sampling and comparison operation, the electrical charge on the first sides of the input capacitor $C_{in}$, output capacitor $C_{out}$ 236 and selected voltage dividing capacitors may be cleared by closing the clear switch 238. When the share switch 246 is closed to share the electrical charge of the input $C_{in}$ 230 with one or more selected voltage dividing capacitors and the output capacitor $C_{out}$ 236, the clear switch 238 may be kept open.

In one embodiment, the plurality of voltage dividing capacitors $C_0$~$C_{N-1}$ 232.1~232.N (e.g., switched capacitors) may be binary weighted capacitors. That is, the capacitors' capacitance are as follows: $C_0 = C_{unit}$, $C_1 = 2^1 C_0$, $C_2 = 2^2 C_0$, $C_3 = 2^3 C_0$, ... $C_{N-1} = 2^{N-1} C_0$. Further, each switched capacitor 232.1~232.N may have a matching resistance on its branch of circuit such that each switched capacitor may have a substantially equal RC time constant. For example, each switch of the plurality of dividing switches 234.1~234.N may have a certain resistance R, such that each $R_i * C_i$ (i=1 ... N) may be equal. Thus, no matter which switched capacitors is/are selected, they will have settle at approximately same time. In another embodiment, the voltage dividing capacitors may be of equal capacitance (e.g., N switched capacitors of unit capacitance $C_{N-1} = C_1 = C_0$).

In one embodiment, the power supply system 200 may also provide a third power supply line 205 for a third power supply (e.g., low voltage digital power supply DLVDD shown in dashed line). In this embodiment, the power supply system 200 may further comprise a third input switch 254 for the capacitive voltage divider 260 and a charge switch 256 connected between the first power supply line and the third power supply line. Thus, the control logic block 240 and the capacitive voltage divider 260 may selectively monitor voltage levels on three different power supply lines (e.g., for $V_{EXT}$, DVDD and DLVDD).

In one embodiment, each of the power supplies $V_{EXT}$, DVDD and DLVDD may have a different set of threshold values to be monitored. For example, for DVDD, the threshold values may include: level A, supply too high (e.g., 1.85V); level B, supply too low (e.g., 1.75V); level C, supply dangerously low (e.g., 1.6V); and level D, supply too low for operation (e.g., 1.4V). For DLVDD, the threshold values may include: level A, supply too high (e.g., 1.35V); level B, supply too low (e.g., 1.30V); level C, supply dangerously low (e.g., 1.2V); and level D, supply too low for operation (e.g., 1.1V). For $V_{EXT}$, the threshold values may include: level C, supply dangerously low. The equivalent of level D for $V_{EXT}$ may be monitored directly by POR 220.

Figure 8:
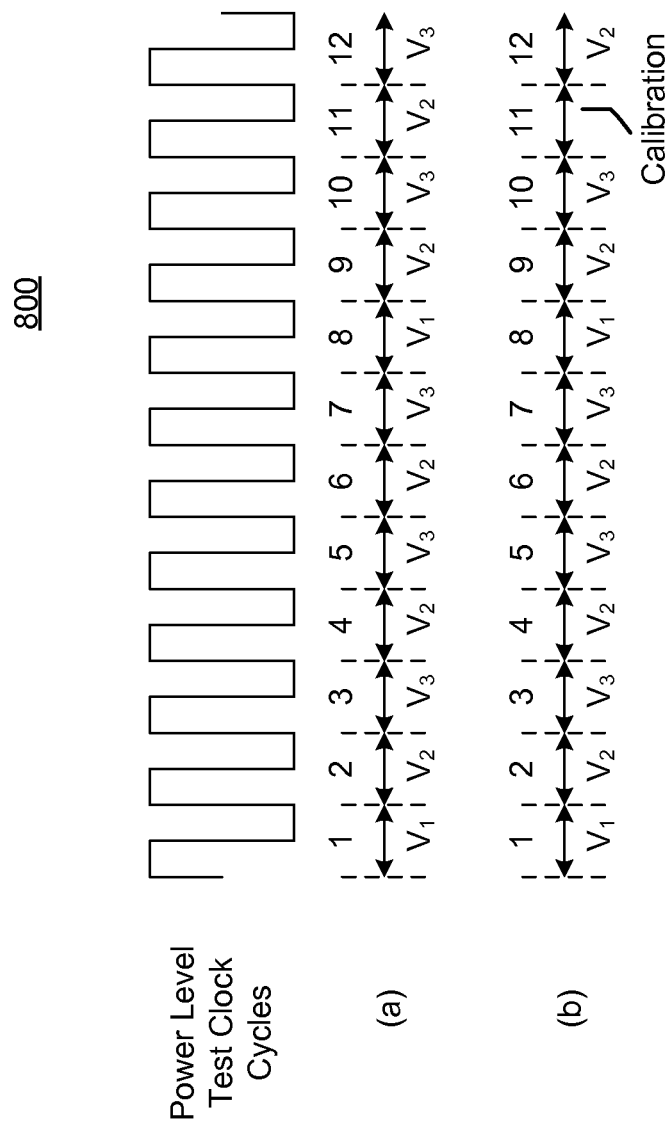
FIG. 8 illustrates two test clock cycle arrangements for monitoring multiple power supplies to an IC chip according to an embodiment of the present invention.

During operation, all three power supplies on the three power supply lines may be monitored (e.g., as shown in FIG. 8 and described in detail below). If any of the monitored power supply of $V_{EXT}$, DVDD and DLVDD goes below level C, a PSM alarm may be raised. If any monitored power supply of DVDD or DLVDD goes below D, the whole chip 270 may be reset.

Levels A and B may be used to perform LDO functions. For example, the chip 270 may operate in a standby mode, in which the LDO 202 may be turned off. When the LDO 202 is turned off, the regulated voltage power supply (e.g., DVDD or DLVDD) may slowly go down due to leak current (i.e. discharge). The control logic block 240 and the capacitive voltage divider 260 may work together to keep the regulated voltage power supply between levels A and B during the standby mode. The capacitive voltage divider 260 may monitor the regulated voltage power supply and the control logic block 240 may execute a control process to control the switch 252. When the monitored regulated power supply voltage level (e.g., either DVDD or DLVDD) goes below level B, the comparator 242 may be triggered. In response, the control process executed by the control logic block 240 may close the switch 252 to charge up the monitored regulated power supply by the first power supply (e.g., external battery). When the monitored power supply voltage level goes over level A, the comparator 242 may be triggered again. In response, the control process executed by the control logic block 240 may open the switch 252 to disconnect the monitored regulated power supply from the first power supply. Thus, during the standby, the regulated voltage power supply may be maintained between levels A and B.

The control logic block 240 may implement a state machine to govern operation of the switch 252 and the switches of the capacitive voltage divider 260. The state machine of the control logic block 240 may not check all levels of a regulated voltage power at all times. In one embodiment, one voltage level may be checked at a time and the state machine may determine which level may be checked at each time. The capacitive voltage divider 260 may be controlled by the state machine to set different comparison levels depending on previous test results. For example, if a previous test result for a regulated voltage power supply (e.g., DVDD or DLVDD) is above PSM alarm level (e.g., level C), then there is no need to check the reset level (e.g., level D). Also, if a previous test result is above level B, then the next test should not be levels C or D. The state machine may be implemented to perform the method of FIG. 5, described in detail below. The switches of switched capacitors may be selected based on the voltage levels need to be tested. For example, to test DVDD level A, $C_{select}$ may be set to a large capacitance so a high input voltage may be divided down to a level comparable to $V_{REF}$. To test DVDD level D, $C_{select}$ may be set to a small capacitance so a low input voltage is divided down just enough as to be comparable to $V_{REF}$.

The oscillator 206 may be a low frequency and low power oscillator that provides watchdog and timer functions. The watchdog circuit may force a reset upon the IC chip based on non-responsiveness. During the standby mode operation, the clock used for the time machine may be based on the oscillator 206. In one embodiment, the state machine and the capacitive voltage divider 260 may perform voltage level comparisons at a frequency of 32 kHz based on clock cycles provided by the oscillator 206. During regular operation (e.g., an active mode), in contrast to the standby mode, the power supplies may be monitored based on a clock provided by a high-frequency and high power oscillator (not shown). The high-frequency and high power oscillator may provide a core frequency to the IC chip 270 (e.g., a core frequency for a microcontroller). In one embodiment, the core frequency may be in the order of MHz (e.g., 16 MHz, or 32 MHz), and the state machine and the capacitive voltage divider 260 may operate in a fraction of the core frequency (e.g., 1/16 of the core frequency) or at full core frequency during regulation operation.

As described above, during startup of the chip 270, the state machine of the control logic block 240 may rely on the POR 220. The POR 220 may be imprecise but may serve to start-up some other circuit blocks on the chip 270, including the control logic block 240. In one embodiment, the POR 220, the voltage reference generator 212 and low power oscillator 206 may start without any reset signal. Once they are up, the control logic block 240 and the capacitive voltage divider 260 may start checking the $V_{DD}$ power supply (DVDD). When DVDD passes the level D, a counter (not shown) may be started to count clock cycles. After a fixed number of clock cycles (e.g., 1024), the reset signal from the POR 220 may be released and the chip 270 may start regular operation. Thus, the start-up sequence involves the POR 220 to generate the reset signal used in control logic block 240. Then, control logic block 240 will monitor the supply line 203 until it goes over level D and supply line 205 until it goes over level D. Then control logic block 240 releases the reset signal for the rest of the chip.

Figure 3:
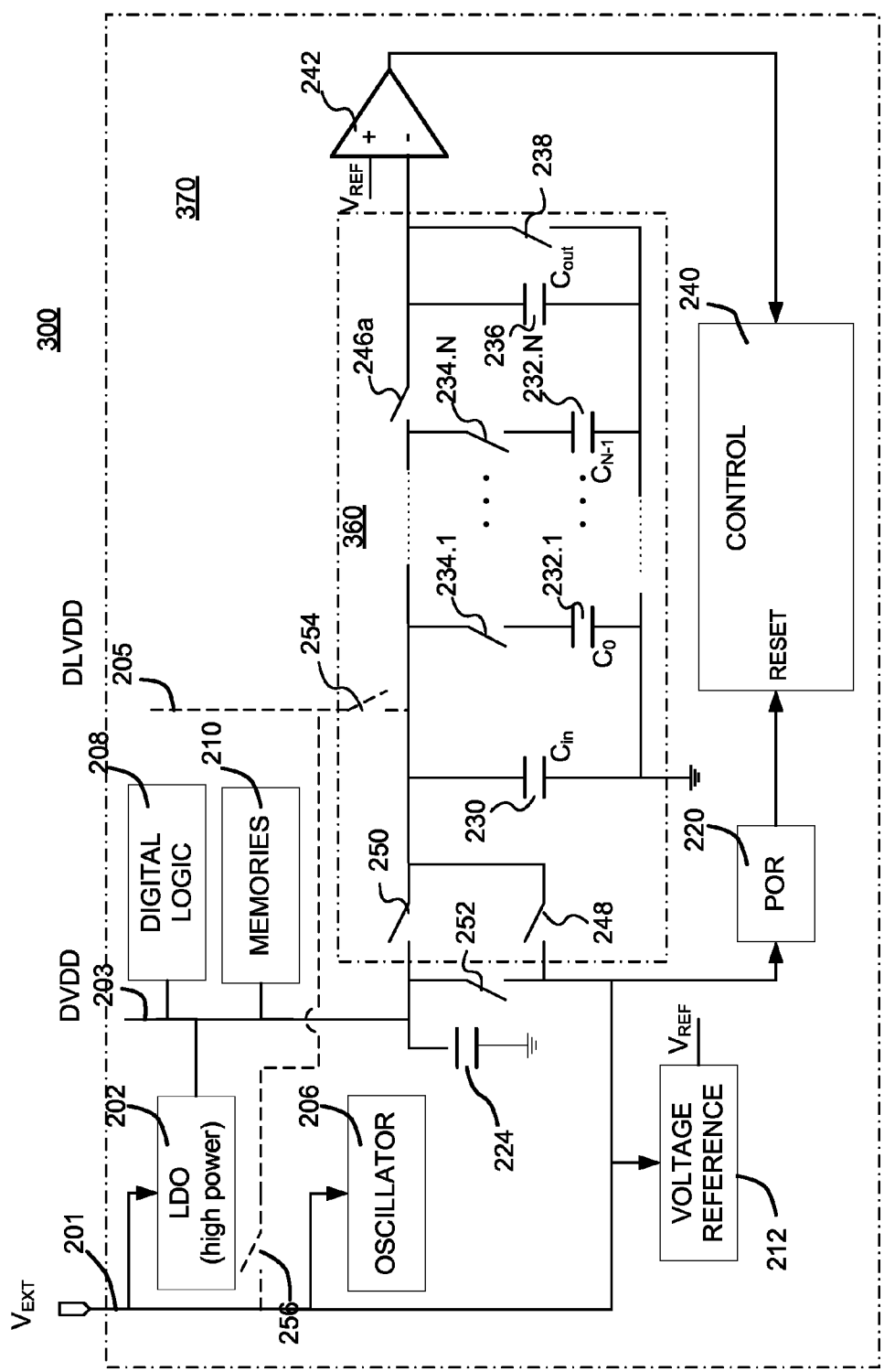
FIG. 3 illustrates a block diagram of another power supply system of an IC chip according to an embodiment of the present invention.

FIG. 3 illustrates a block diagram of another power supply system 300 for an IC chip 370 according to an embodiment of the present invention. The power supply system 300 may differ from the power supply system 200 because of the share switch 246a. As shown in FIG. 2, the share switch 246 of the power supply system 200 may be placed between the input capacitor $C_{in}$ 230 and output side of capacitors (e.g., the plurality of voltage dividing capacitors $C_0 \sim C_{N-1}$ 232.1~232.N and output capacitor $C_{out}$ 236). In comparison, the power supply system 300 may comprise a capacitive voltage divider 360 that may include a share switch 246a located between the input side of capacitors (e.g., the input capacitor $C_{in}$ 230 and voltage dividing capacitors $C_0 \sim C_{N-1}$ 232.1~232.N) and output capacitor $C_{out}$ 236. Other parts of the power supply system 300 and the chip 370 may be the same as those of the power supply system 200 and the chip 270. In one embodiment, moving the voltage dividing capacitors $C_0 \sim C_{N-1}$ 232.1~232.N to the input side may improve precision of the capacitive voltage divider 360 as compared to the capacitive voltage divider 260 when small dividing factors are required.

Figure 4:
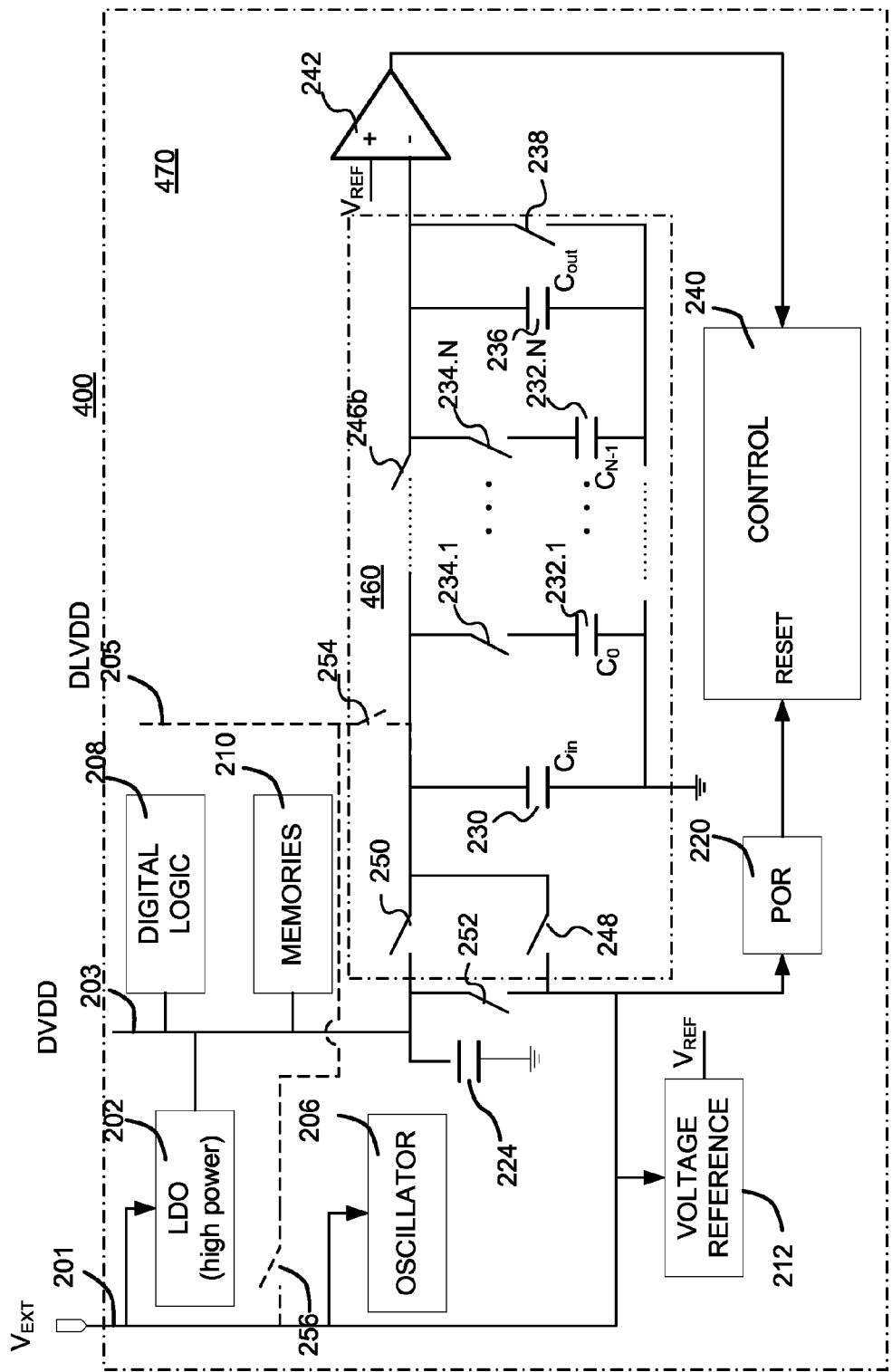
FIG. 4 illustrates a block diagram of another power supply system of an IC chip according to an embodiment of the present invention.

FIG. 4 illustrates a block diagram of another power supply system 400 for an IC chip 470 according to an embodiment of the present invention. The power supply system 400 may comprise a capacitive voltage divider 460 that may include a share switch 246b located between the input side of capacitors (e.g., the input capacitor $C_{in}$ 230 and some voltage dividing capacitors $C_0 \sim C_{N-1}$ 232.1~232.N) and output side of capacitors (e.g., the output capacitor $C_{out}$ 236 and rest of the voltage dividing capacitors $C_0 \sim C_{N-1}$ 232.1~232.N). Other parts of the power supply system 400 and the chip 470 may be the same as those of the power supply system 200 and the chip 270.

Figure 5:
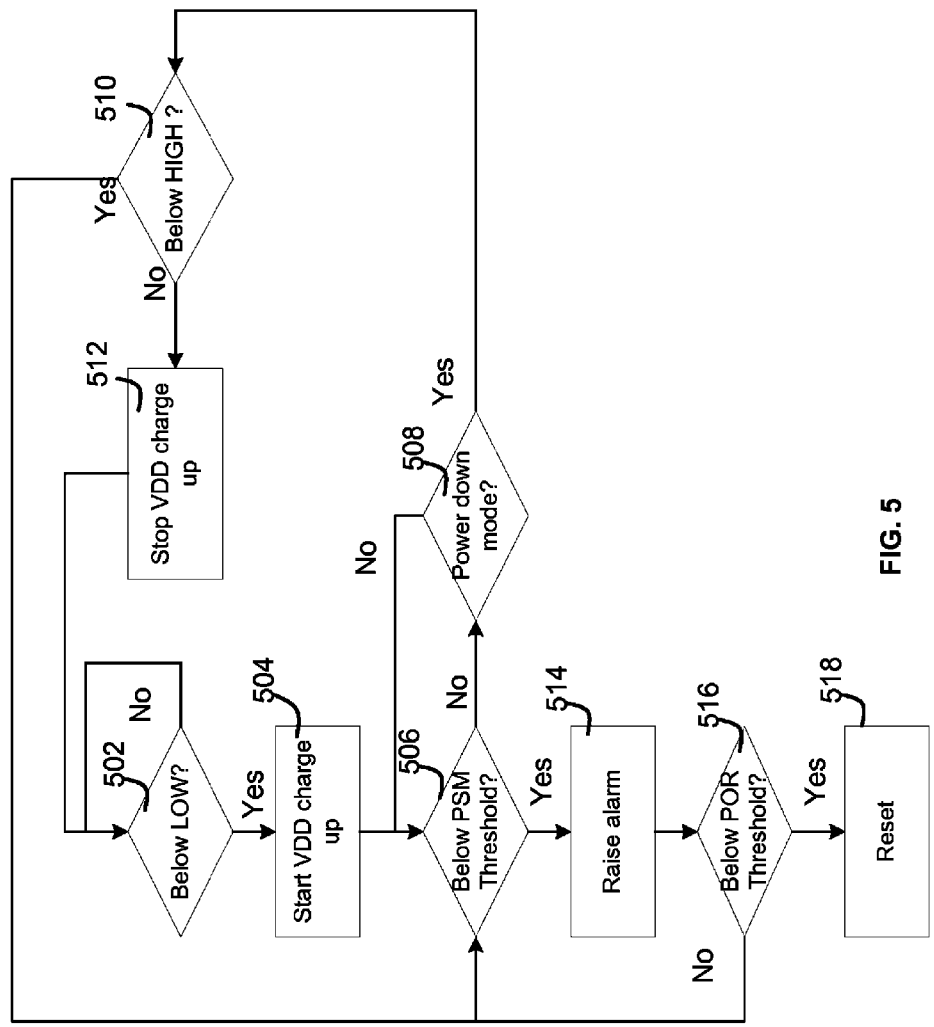
FIG. 5 illustrates a flowchart for a state machine to monitor and control a regulated power supply on an IC chip according to an embodiment of the present invention.
Figure 6:
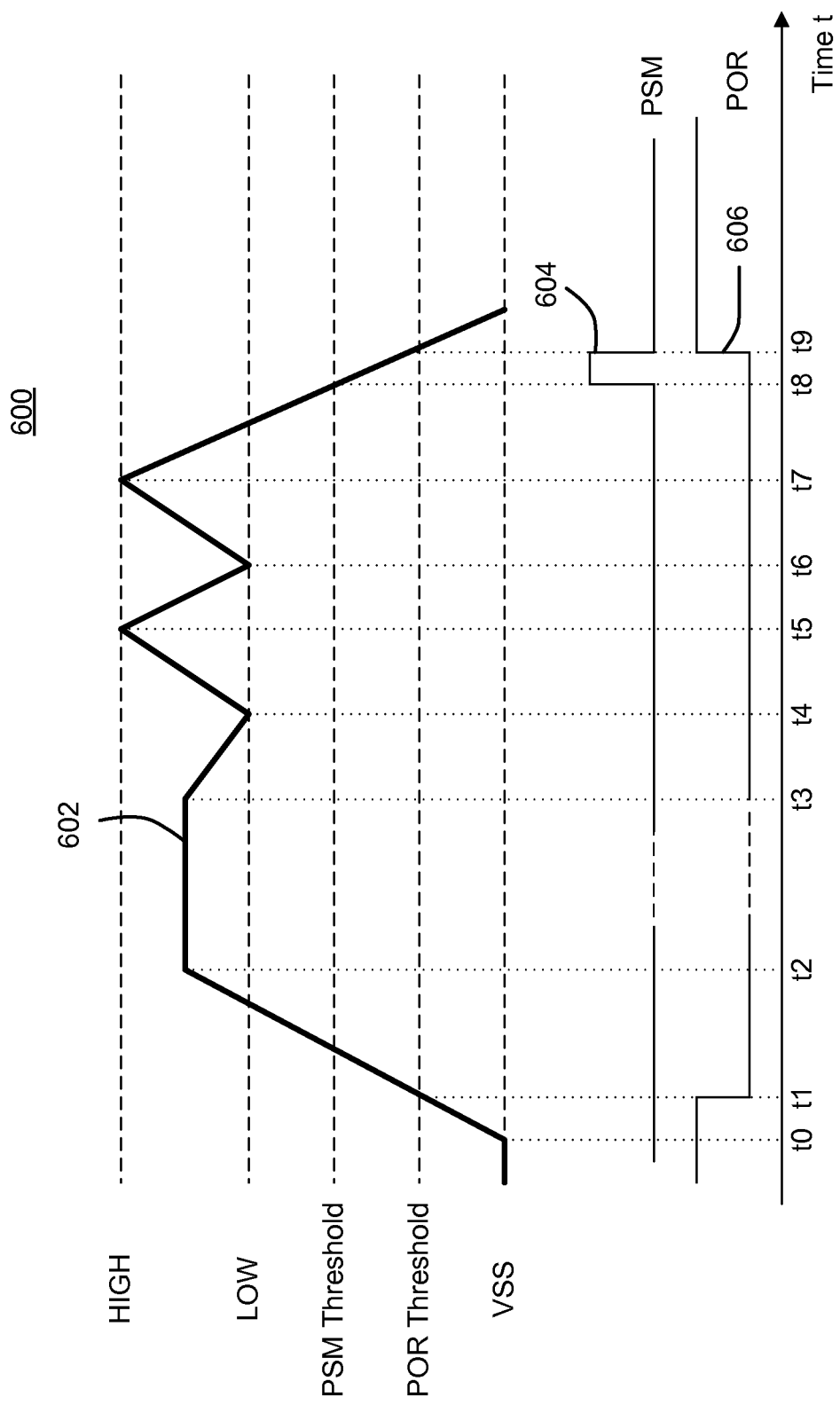
FIG. 6 illustrates a regulated power supply and PSM/POR control signals triggered by changes of the regulated power supply signal according to an embodiment of the present invention.

FIG. 5 illustrates a flowchart 500 for a state machine to monitor and control a regulated power supply on an IC chip according to an embodiment of the present invention. The flowchart 500 may be implemented for the state machine of the control logic block 240, and the test of voltage levels may be performed by the capacitive voltage divider 260 and the comparator 242. The regulated power supply to be monitored and controlled may be illustrated by FIG. 6 according to an embodiment of the present invention. As shown in FIG. 6, a regulated power supply 602 (e.g., DVDD or DLVDD) on a chip (e.g., the chip 270) may be rise from VSS (e.g., Ground) at time t0 when the chip is powered up. At time t1, the regulated power supply 602 may rise pass the POR threshold. At time t2, the regulated power supply 602 may reach its regular operation level and may be maintained at this level by a voltage regulator (e.g., LDO 202). At time t3, the chip may enter into a standby mode of operation and the voltage regulator may be turned off, and thus, the regulated power supply 602 may start to decline due to leak current or discharge.

Referring to the flowchart 500, at time t0, the state machine may start monitoring the regulated power supply 602 at block 516, provided POR 220 has already released the reset signal associated to $V_{EXT}$. At block 516, the state machine may determine whether the tested power supply is below the POR threshold (e.g., level D). If no, the state machine will perform block 516 repeatedly in subsequent test cycles allocated to monitor the regulated power supply 602. As the supply voltage 602 ramps up, the state machine comes out of the state tested by block 516 (at time t1) and then enters the state tested by block 506. The state machine stays in block 506 as long as the voltage 602 is higher than level C and the IC chip is not on stand-by mode.

At time t3 the IC chip enters stand-by mode and the LDO 202 is turned off. The voltage 602 starts to droop as there is no active voltage regulator. At time t4, the regulated power supply 602 may decline to reach the LOW threshold and the block 502 may get a test result of "Yes." Once block 502 has a "Yes" test result, the state machine may start a charging operation at the block 504. For example, if the regulated power supply to be tested is DVDD of FIG. 2, the charge switch 252 may be connected to charge up the DVDD; if the regulated power supply to be tested is DLVDD of FIG. 2, the charge switch 256 may be connected to charge up the DLVDD.

In a next test cycle allocated to monitoring the regulated power supply 602, the state machine may perform the decision block 506 to determine whether the regulated power supply 602 is below the PSM threshold (e.g., level C). If no, the state machine may determine, at block 508, whether the chip is operating in a power down mode (e.g., standby mode). If the chip is not operating in the power down mode, the state machine may go back to the decision block 506 in a next test cycle allocated to monitoring the regulated power supply 602. If the chip is operating in the power down mode, the state machine may perform the decision block 510 to determine whether the regulated power supply 602 is below a HIGH threshold (e.g., level A) in the next allocated test cycle. If the regulated power supply 602 is below the HIGH threshold, the state machine may go back to the decision block 506. As shown in FIG. 6, the regulated power supply 602 may rise up between the time t4 and time t5. Thus, between the time t4 and time t5, the state machine may repeatedly perform decision blocks 506, 508 and 510 in consequent test clock cycles allocated to the regulated power supply 602.

At time t5, the regulated power supply 602 may reach the HIGH threshold. In a next test for decision block 510, the state machine may determine that the regulated power supply 602 has reached the HIGH threshold and perform the block 512 to stop the charging operation. For example, if the regulated power supply 602 to be tested is DVDD of FIG. 2, the charge switch 252 may be disconnected to stop charging the DVDD; if the regulated power supply 602 to be tested is DLVDD of FIG. 2, the charge switch 256 may be disconnected to stop charging the DLVDD. Thereafter, the regulated power supply 602 may start to decline and the state machine may go back to perform decision block 502 again. From time t5 to time t6, the state machine may repeat the blocks 502, 504, 506, 508, 510 and 512 similar to time t3 to time t4 as described above.

After the regulated power supply 602 reaches the HIGH threshold again at time t7 and the state machine performs the block 512 to stop the charging operation, the state machine may repeatedly test the regulated power supply 602 to determine if it falls below the LOW threshold. When the regulated power supply 602 falls below the LOW threshold, the state machine may perform block 504 to start the charging operation and starts monitoring the PSM threshold. If the regulated power supply 602 keeps going down (e.g., the first power supply VEXT fails to charge the regulated power supply 602), the block 506 may have a test result of "Yes" and the state machine may raise an alarm at the block 514 (e.g., generate a PSM signal 604 as shown in FIG. 6). Thereafter, the state machine may perform test of block 516 to determine whether the regulated power supply 602 is below the POR level (e.g., level D). If no, the state machine may go back to the block 506 in the next allocated test clock cycle. If yes, the state machine may generate a RESET signal at the block 518 (e.g., POR signal 606 as shown in FIG. 6).

Figure 7:
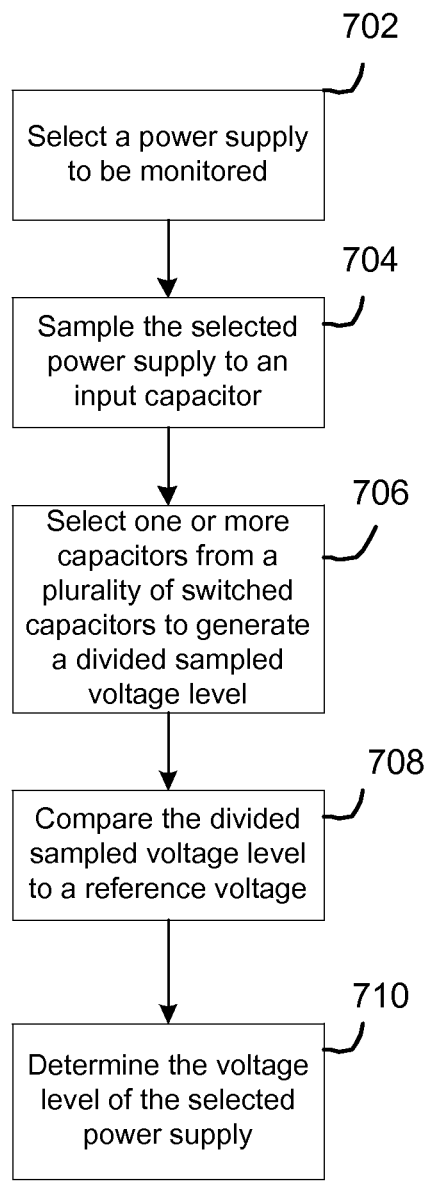
FIG. 7 illustrates a process for monitoring a power supply to an IC chip according to an embodiment of the present invention.

FIG. 7 illustrates a process 700 for monitoring a power supply line on an IC chip by a power supply system onboard the chip according to an embodiment of the present invention. The process 700 may be performed by the power supply systems 200, 300 and 400 as described above with respect to FIGS. 2-4. The process 700 may start at step 702, at which the power supply system may select a power supply to be monitored. As shown in FIG. 2, for example, a plurality of power supply lines (e.g., for a different power supplies $V_{EXT}$, DVDD, DLVDD) on a chip may be monitored. The power supply system may select one from the plurality of power supply lines to monitor (e.g., by closing one of the switches 248, 252 and 256 for $V_{EXT}$, DVDD, DLVDD, respectively). Then the process 700 may proceed to step 704. At step 704, the process 700 may sample a voltage level of the selected power supply line to an input capacitor (e.g., the input capacitor $C_{in}$ 230) of the power supply system.

Then, at step 706, the process 700 may select one or more capacitors from a plurality of switched capacitors to generate a divided sampled voltage level. As described above, the power supply system may comprise a control logic block 240 that implements a state machine (e.g., FIG. 5). The state machine may determine which voltage level (e.g., levels A, B, C, or D) need to be tested and select certain switches among a plurality of dividing switches 234.1~234.N to generate a divided sampled voltage level on an output capacitor $C_{out}$ 236 by closing the share switch 246 (or 246a, 246b). For example, if the selected power supply is DVDD and to be tested power level is level A (e.g., 1.85V), then the divided sampled voltage may be $$V_{out} = \frac{V_{in} \times C_{in}}{C_{in} + C_{out} + C_{select}} = \frac{1.85 V \times C_{in}}{C_{in} + C_{out} + C_{select}}.$$

If the reference voltage is 0.9V, then the $$C_{select} = \frac{1.85}{0.9} \times C_{in} - C_{in} - C_{out}.$$

The process 700 may then proceed to step 708, at which the power supply system may compare the divided sampled voltage level to a reference voltage. After the comparison, at step 710, the process 700 may determine the voltage level of the selected power supply line. For example, the power supply system 200 may determine whether the voltage level on the selected power supply is above or below a certain level according to the state machine.

FIG. 8 illustrates two example test clock cycle arrangements for monitoring multiple power supply lines on an IC chip according to an embodiment of the present invention. FIG. 8(a) shows one exemplary arrangement of the test clock cycles for monitoring three power supplies. As shown in FIG. 8(a), a first monitored power supply V1 (e.g., the external power supply) may be tested once for every 7 test clock cycles (e.g., tested at $1^{st}$ and $8^{th}$ clock cycles). A second monitored power supply V2 (e.g., DVDD) may be tested three times for every 7 test clock cycles (e.g., tested at $2^{nd}$, $4^{th}$ and $6^{th}$ clock cycles). A third monitored power supply V3 (e.g., DLVDD) may be tested three times for every 7 test clock cycles (e.g., tested at $3^{rd}$, $5^{th}$ and $7^{th}$ clock cycles).

FIG. 8(b) shows another exemplary arrangement of the test clock cycles for monitoring three power supply lines. In addition to periodically test three monitored power supplies (e.g., testing V2 and V3 each three times between each V1 tests), a calibration may be periodically performed. For example, an autozero calibration may be implemented by disconnecting the comparator 242 from the divider block 260 and re-organize its internal nodes so its voltage offset is measured and stored adequately. Once the autozero process is completed, comparator 242 may be reconnected to block 260 and regular operation may continue.

Several embodiments of the present invention are specifically illustrated and described herein. However, it will be appreciated that modifications and variations of the present invention are covered by the above teachings and within the purview of the appended claims without departing from the spirit and intended scope of the invention.

It should be understood that there exist implementations of other variations and modifications of the invention and its various aspects, as may be readily apparent to those of ordinary skill in the art, and that the invention is not limited by specific embodiments described herein. Features and embodiments described above may be combined. It is therefore contemplated to cover any and all modifications, variations, combinations or equivalents that fall within the scope of the basic underlying principals disclosed and claimed herein.

We claim:

1. A power supply circuit, comprising:
a power supply line for a power supply;
a capacitive voltage divider having an input switch, an input capacitor, a plurality of switched capacitors and an output capacitor, the capacitive voltage divider to sample a voltage level of the power supply line by closing the input switch, and to generate a divided sampled voltage on the output capacitor by selectively connecting the switched capacitors;
a comparator coupled to the output capacitor to compare the divided sampled voltage to a reference voltage; and
a control circuit to control the capacitive voltage divider for closing the input switch and selecting the switched capacitors.

2. The power supply circuit of claim 1, further comprising:
a second power supply line for a second power supply; and
a first charging switch connected between the power supply line and the second power supply line; wherein the capacitive voltage divider further includes a second input switch to connect the input capacitor to the second power supply line.

3. The power supply circuit of claim 2, wherein the capacitive voltage divider further includes:
a share switch to connect the input capacitor to the output capacitor to generate the divided sampled voltage on the output capacitor,
a plurality of dividing switches each to connect a respective switched capacitor to the output capacitor, and
a clear switch to clear electrical charges on the input capacitor, output capacitor and switched capacitors to ground.

4. The power supply circuit of claim 3, wherein the plurality of switched capacitors are binary weighted capacitors.

5. The power supply circuit of claim 3, wherein the plurality of switched capacitors each has unit capacitance that matches unit capacitance of the input and output capacitors.

6. The power supply circuit of claim 5, further comprising a third power supply line and a second charging switch, wherein the capacitive voltage divider further includes a third input switch to connect the input capacitor to the third power supply line.

7. The power supply circuit of claim 6, wherein the control circuit controls the input switches, share switch, clear switch and the plurality of dividing switches to periodically test voltage levels for each of the power supply lines.

8. The power supply circuit of claim 2, wherein in a standby mode of operation, the control circuit controls opening and closing of the first charging switch to maintain the voltage level on the second power supply line between a high threshold and a low threshold.

9. The power supply circuit of claim 1, wherein the power supply line is a supply for other circuits of a common integrated circuit.

10. An IC chip, comprising:
a power supply circuit, comprising:
a power supply line for a power supply;
a capacitive voltage divider having an input switch, an input capacitor, a plurality of switched capacitors and an output capacitor, the capacitive voltage divider to sample a voltage level of the power supply line by closing the input switch, and to generate a divided sampled voltage on the output capacitor by selectively connecting the switched capacitors;
a comparator coupled to the output capacitor to compare the divided sampled voltage to a reference voltage; and
a control circuit to control the capacitive voltage divider for closing the input switch and selecting the switched capacitors.

11. The IC chip of claim 10, wherein the power supply circuit further comprises:
a second power supply line for a second power supply; and
a first charging switch connected between the power supply line and the second power supply line; wherein the capacitive voltage divider further includes a second input switch to connect the input capacitor to the second power supply line.

12. The IC chip of claim 11, wherein the capacitive voltage divider further includes:
a share switch to connect the input capacitor to the output capacitor to generate the divided sampled voltage on the output capacitor,
a plurality of dividing switches each to connect a respective switched capacitor to the output capacitor, and
a clear switch to clear electrical charges on the input capacitor, output capacitor and switched capacitors to ground.

13. The IC chip of claim 12, wherein the plurality of switched capacitors are binary weighted capacitors.

14. The IC chip of claim 12, wherein the plurality of switched capacitors each has unit capacitance that matches unit capacitance of the input and output capacitors.

15. The IC chip of claim 14, further comprising a third power supply line and a second charging switch, wherein the capacitive voltage divider further includes a third input switch to connect the input capacitor to the third power supply line.

16. The IC chip of claim 15, wherein the control circuit controls the input switches, share switch, clear switch and the plurality of dividing switches to periodically test voltage levels for each of the power supply lines.

17. The IC chip of claim 11, wherein in a standby mode of operation, the control circuit controls opening and closing of the first charging switch to maintain the voltage level on the second power supply line between a high threshold and a low threshold.

18. The IC chip of claim 11, further comprising a digital logic block for a microcontroller and memories connected to the second power supply line to receive power.

19. The IC chip of claim 10, wherein the power supply line is a supply for other circuits of the IC chip.

20. A method to control power supply for an IC chip, comprising:
- sample a voltage level on a power supply line on the IC chip;
- select one or more switched capacitors from a plurality of switched capacitors to generate a divided sampled voltage level;
- compare the divided sampled voltage level to a reference voltage; and
- determine the voltage level of the power supply line.

21. The method of claim 20, wherein the power supply line is periodically selected from a plurality of power supply lines.

22. The method of claim 20, wherein sampling is performed by closing an input switch connected between the power supply line and an input capacitor.

23. The method of claim 22, further including:
- connecting a clear switch to clear electrical charges on the input capacitor, an output capacitor and the switched capacitors to ground.

24. The method of claim 20, further including, in a standby mode of operation, connecting a charging switch to maintain the voltage level on the power supply line between a high threshold and a low threshold.

\* \* \* \* \*